United States Patent
Daubenspeck et al.

(10) Patent No.: US 6,946,379 B2
(45) Date of Patent: Sep. 20, 2005

(54) INSULATIVE CAP FOR LASER FUSING

(75) Inventors: Timothy H. Daubenspeck, Colchester, VT (US); Thomas L. McDevitt, Underhill, VT (US); William T. Motsiff, Essex Junction, VT (US); Henry A. Nye, III, Brookfield, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/860,470

(22) Filed: Jun. 3, 2004

(65) Prior Publication Data

US 2004/0217384 A1 Nov. 4, 2004

Related U.S. Application Data

(62) Division of application No. 09/684,463, filed on Oct. 6, 2000, now Pat. No. 6,784,516.

(51) Int. Cl.[7] .............................................. H01L 21/44
(52) U.S. Cl. ...................... 438/601; 438/540; 438/132
(58) Field of Search ................................ 438/601, 600, 438/132, 540, 128, 215, 467

(56) References Cited

U.S. PATENT DOCUMENTS

| 4,198,744 A | 4/1980 | Nicolay |
| 4,536,949 A | 8/1985 | Takayama et al. |
| 5,273,920 A | 12/1993 | Kwasnick et al. |
| 5,447,887 A | 9/1995 | Filipiak et al. |
| 5,659,201 A | 8/1997 | Wollesen |
| 5,731,624 A | 3/1998 | Motsiff et al. |
| 5,760,453 A * | 6/1998 | Chen .......................... 257/529 |
| 5,955,773 A | 9/1999 | Stamper |
| 6,127,721 A | 10/2000 | Narayan et al. |
| 6,242,792 B1 * | 6/2001 | Miura et al. ................. 257/536 |
| 6,300,252 B1 | 10/2001 | Ying et al. |
| 6,335,229 B1 | 1/2002 | Pricer et al. |
| 6,392,300 B1 * | 5/2002 | Koike ......................... 257/758 |

FOREIGN PATENT DOCUMENTS

| JP | 1-225135 | 9/1989 |
| JP | 8-274178 | 10/1996 |
| JP | 11-214389 | 8/1999 |

OTHER PUBLICATIONS

IBM Technical Disclosure Bulletin, vol. 32, No. 3A, Aug. 1989, Fuse Structure for Wide Fuse Materials Choice, pp. 438–439.

Silicon Nitride Coatings on Copper, Audisio et al., vol. 119, No. 4, Apr. 1972, Electrochemical Society, pp. 408–411.

* cited by examiner

Primary Examiner—Caridad Everhart
(74) Attorney, Agent, or Firm—Schmeiser, Olsen & Watts; William D. Sabo

(57) ABSTRACT

A semiconductor device having at least one fuse and an alignment mark formed therein. An etch resistant layer over the surface of the fuse and alignment mark, which provides a uniform passivation thickness for use in conjunction with laser fuse deletion processes.

20 Claims, 2 Drawing Sheets

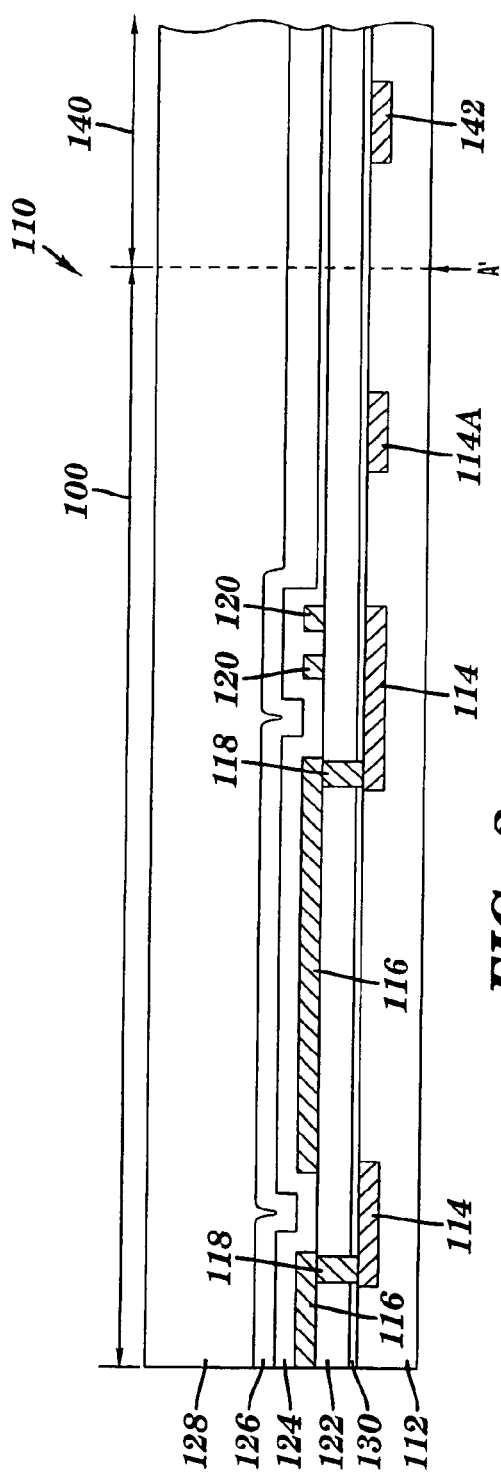
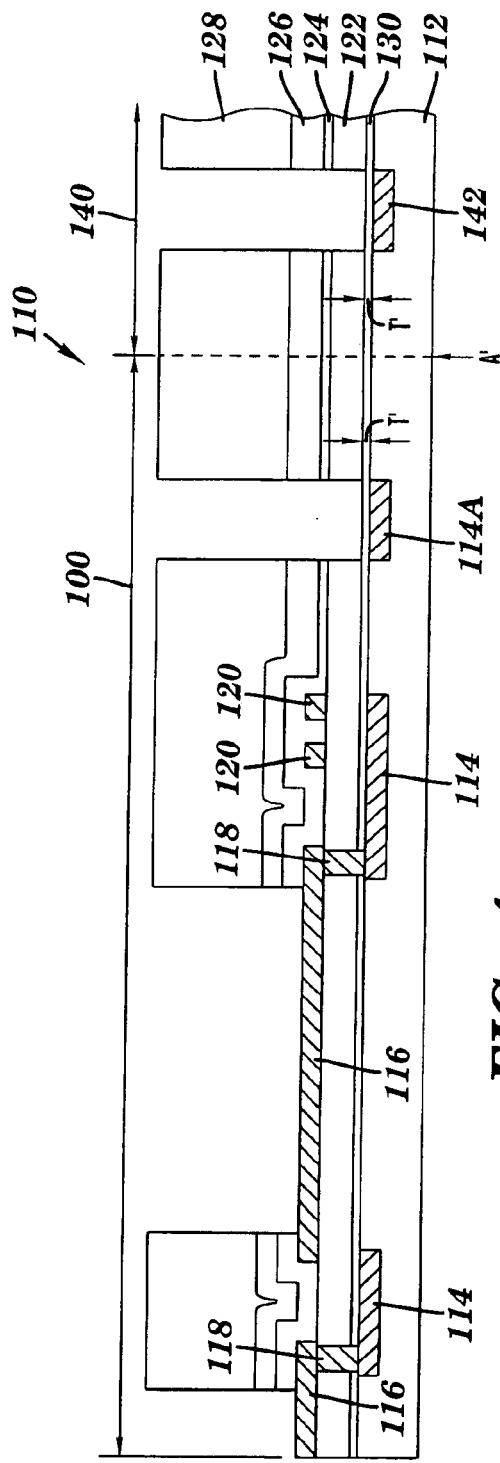

INSULATIVE CAP FOR LASER FUSING

This application is a divisional of Ser. No. 09/684,463; filed on Oct. 6, 2000, now U.S. Pat. No. 6,784,516.

BACKGROUND OF THE INVENTION

1. Technical Field

The present invention relates generally to integrated circuits having fuse elements, and more particularly, to a laser fuse deletion process.

2. Related Art

Fuses formed within integrated circuits serve several functions. For example, fuses may be formed within a circuit to provide redundancy. In other words, particular fuses may be deleted or opened to re-route circuitry along alternate pathways in the event of a failure. Alternatively, fuses may be selectively deleted to form a matrix of opens and shorts unique to that circuit which may easily be recognized by an electrical computer identification system.

Laser fusing processes are typically used to delete specific fuses. During a laser fuse deletion process the fuse structure, including the size, shape and material of the fuse itself, as well as the type and thickness of the material covering the fuse, are of critical importance to the quality of the fuse deletion. Accordingly, it is desirable to optimize any or all of these parameters to enhance the success of the fuse deletion process.

SUMMARY OF THE INVENTION

The first general aspect of the present invention provides a semiconductor device comprising: a substrate; at least one fuse formed within the substrate; and an etch resistant layer over at least one of the formed fuses.

The second general aspect of the present invention provides a method of forming a fuse structure, comprising: providing a substrate having at least one fuse formed therein; and depositing an etch resistant layer over a surface of the substrate.

The third general aspect of the present invention provides a method of performing a fuse deletion process, comprising: providing a substrate having at least one fuse therein, an etch resistant layer over the fuse and at least one insulative layer over the etch resistant layer; removing a portion of the at least one insulative layer above the fuse to the etch resistant layer; and applying a radiant energy source to the fuse until the etch resistant layer is partially removed.

The foregoing and other features and advantages of the invention will be apparent from the following more particular description of the embodiments of the invention.

BRIEF DESCRIPTION OF THE DRAWINGS

The embodiments of this invention will be described in detail, with reference to the following figures, wherein like designations denote like elements, and wherein:

FIG. 3 depicts a cross-sectional view of a semiconductor device in accordance with the present invention; and FIG. 4 depicts the semiconductor device of FIG. 3 following an etch.

DESCRIPTION OF THE PREFERRED EMBODIMENTS

Although certain embodiments of the present invention will be shown and described in detail, it should be understood that various changes and modifications may be made without departing from the scope of the appended claims. The scope of the present invention will in no way be limited to the number of constituting components, the materials thereof, the shapes thereof, the relative arrangement thereof, etc. Although the drawings are intended to illustrate the present invention, the drawings are not necessarily drawn to scale.

Figure 1:
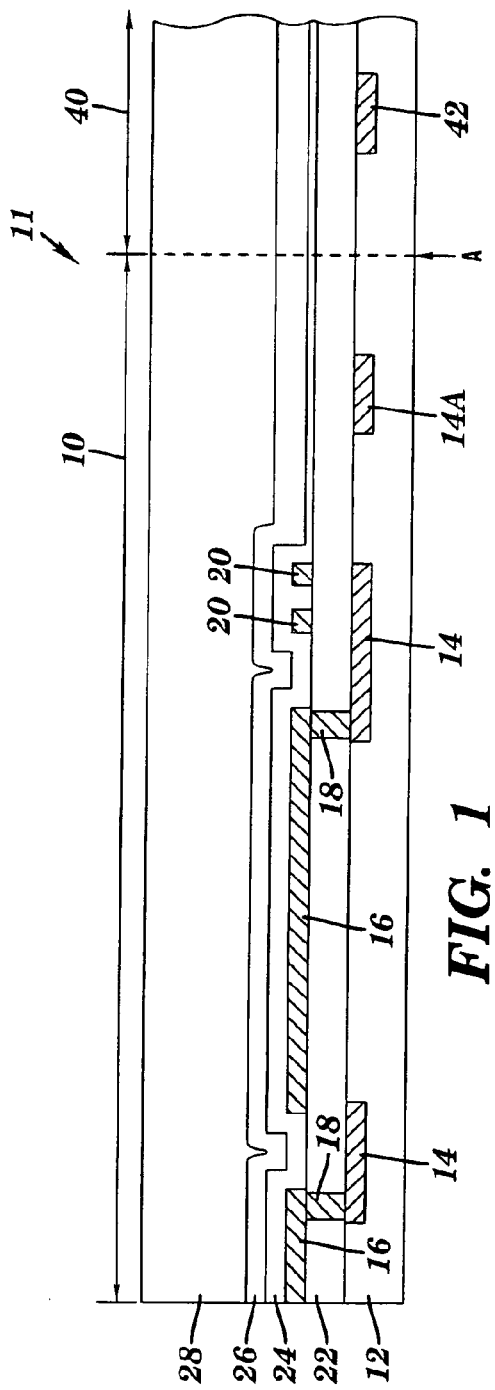
FIG. 1 depicts a cross-sectional view of a related art semiconductor device.

Referring to the drawings, FIG. 1 shows a cross-sectional view of a related art semiconductor device 10, e.g., a Back-End-of-the-Line (BEOL) integrated circuit, or a chip as part of a semiconductor wafer 11, wherein the individual device 10 is eventually separated from the wafer 11 prior to shipping, by cutting along line A. In this example, the device 10 comprises a substrate 12, having several metal wiring layers formed therein, of which only the last metal wiring layer 14 is shown. The metal wiring layer 14 comprises copper, or other similarly used material. At least one region of the last metal wiring layer forms a fuse 14A. The remaining regions of the metal wiring layer 14 are electrically connected to contact pads 16 via interconnections 18. The contact pads 16 comprise aluminum, or other similar conductive material. The interconnections 18 comprise tungsten or other similarly used conductive material. The device 10 further includes wiring 20, formed of the same or similar material, and at the same time, as the contact pads 16.

A first insulative layer 22, comprising oxide, located between the metal wiring layer 14 and the contact pads 16, provides electrical insulation between layer 14 and the pads 16. A plurality of insulative layers 24, 26 and 28 are deposited on the surface of the contact pads 16, the wiring 20, and the exposed first insulative layer 22. In particular, the second insulative layer 24 comprises oxide, the third insulative layer 26 comprises nitride, and the fourth insulative layer comprises polyimide.

An alignment mark 42 is located within the "kerf" 40, or the space on the wafer 11 between adjacent devices 10. The alignment mark 42, also formed of the metal wiring layer 14, is formed of a similar material as the fuse 14A. The alignment mark 42 provides an optical target for a laser during a subsequent laser fuse deletion process (described in more detail infra).

A layer of photoresist (not shown) is deposited over the surface of the fourth insulative layer 28. Using a first mask (not shown), openings are patterned within the fourth insulative layer 28 above the contact pads 16, the fuse 14A and the alignment mark 42. Using an appropriate etch process, either a wet etch or a reactive ion etch (RIE), the patterned openings are transferred into the fourth insulative layer 28, stopping at the third insulative layer 26.

Figure 2:
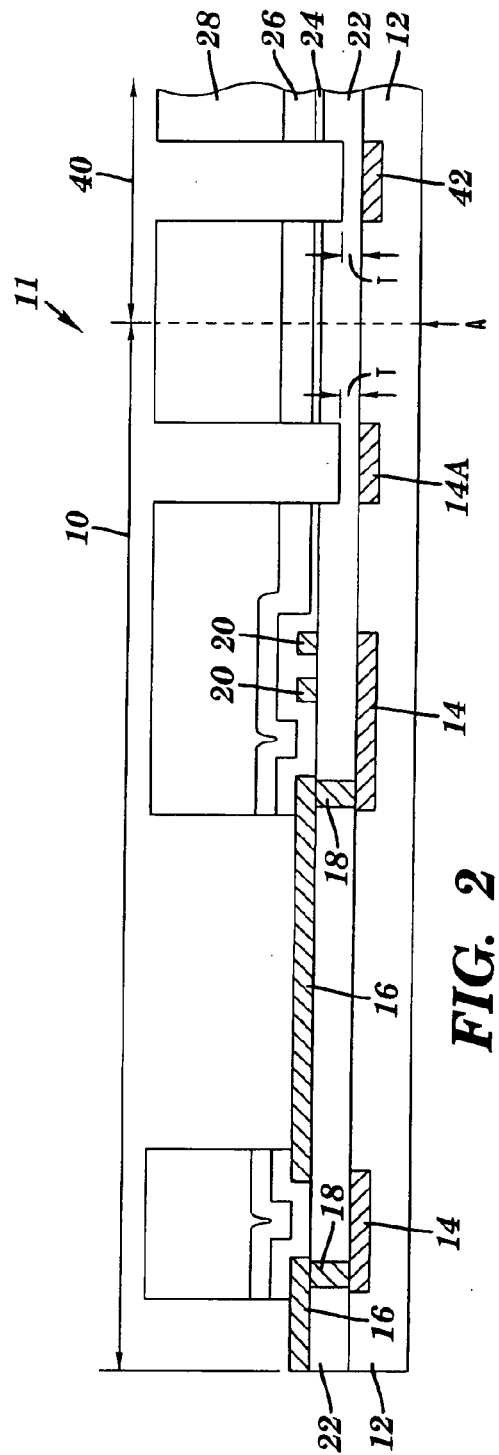
FIG. 2 depicts the related art semiconductor device of FIG. 1 following an etch.

As illustrated in FIG. 2, the third 26 and second insulative layers 24 are then etched, using a dry RIE, above the contact pads 16, the fuse 14A and the alignment marks 42. An "over-etch" is then performed to ensure that the surface of the contact pads 16 are thoroughly cleaned, thereby providing sufficient electrical contact. During the over-etch, the second insulative layer 24 etch chemistries are continually performed to remove any excess portions of the second insulative layer 22 over the contact pads 16. During the over-etch, a portion of the first insulative layer 22 covering the fuse 14A and the alignment mark 42 is also partially removed. Depending upon the duration and location of termination of the over-etch, the amount of remaining first insulative layer 22 covering both the fuse 14A and the alignment mark 42 is non-uniform and often locally too thick to allow successful laser deletion of the fuse link.

The process of etching the first insulative layer 22 requires a great deal of care because removing too much or all of the first insulative layer 22 over the fuse 14A will alter the character of fuse delete for a specific fusing energy and potentially will leave undeleted fuses exposed to the processing and packaging environments. These environments are often corrosive to high conductivity metals like copper. Alternatively, removing too little of the first insulative layer 22 may result in the inability of the laser to detect and locate the alignment mark 42, or successfully delete the fuse 14A.

Thereafter, a laser fuse deletion process, which is used to open the fuse 14A, is performed. In particular, an infra-red laser locates the alignment mark 42 within the kerf 40. After the laser locates the alignment mark 42, the controlling software directs the laser to the fuse 14A to be deleted. Thereafter, the laser emits a beam, having a specified amount of energy, through the remaining passivation thickness T covering the fuse 14A and into the fuse 14A. As the laser beam interacts with the metal fuse 14A material, the fuse 14A begins to heat up and expand, forcing the weakest regions surrounding the fuse 14A to rupture or explode. By design, the weakest region is intended to be the passivation thickness T of the first insulative layer 22 over the top of the fuse 14A. Following the rupture, the molten metal within the fuse 14A vaporizes leaving a discontinuity within the metal wiring layer 14, which causes a high electrical resistance in that region of the device 10.

However, depending upon the duration and uniformity of the over-etch the passivation thickness T covering the fuse 14A and the alignment mark 42 may vary. As a result, several problems may arise during the subsequent laser fuse deletion process. For example, if the passivation thickness T of the first insulative layer 22, which covers both the fuse 14A and the alignment mark 42, is too great following the over-etch, the pre-programmed laser may be incapable of locating the alignment mark 42. As a result, the laser will be unable to locate the fuse 14A and properly perform the fuse deletion, or the laser may perform the fuse deletion in the wrong region of the device 10, and so on. Conversely, if the duration of the over-etch is not closely monitored, the passivation thickness T may be eliminated altogether resulting in a comprised fuse structure.

Additionally, if the passivation thickness T of the first insulative layer 22 covering the fuse 14A is too great the fuse 41A may blow in the wrong direction. For instance, if the passivation thickness T is thicker than the other regions surrounding the fuse 14A, the expansion of the metal within the fuse 14A caused by the laser may result in the fuse 14A blowing out the bottom or sides of the substrate 12, rather than the through the passivation thickness T, as intended. In other words, the greater the passivation thickness T the greater the resistance to expansion as compared to the surrounding areas of the device 10.

Furthermore, the input conditions, including the necessary input power of the laser, the shape and diameter of the laser beam, etc., are programmed based upon the fuse 14A having the greatest predetermined passivation thickness T. However, due to the uneven etching from fuse 14A to fuse 14A that may result during the over-etch, some fuse positions will receive excessive laser input energy, which may lead to excessive insulator cracking or substrate damage. This is particularly problematic when the materials below the fuse 14A comprise low-k dielectric materials, which typically exhibit greater processing variability.

Therefore, in order to overcome these and other problems, the present invention carefully controls the passivation thickness above the fuse and alignment mark. FIG. 3 shows a cross-sectional view of a semiconductor device 100 in accordance with the present invention, i.e., a chip as part of a semiconductor wafer 110, wherein the individual device 100 is eventually separated from the wafer 110 prior to shipping, by cutting along line A'. In this example, the device 100 further includes a substrate 112, having several metal wiring layers formed therein, of which only the last metal wiring layer 114 is shown for ease of illustration. The metal wiring layer 114 comprises copper, or other similarly used material. At least one region of the metal wiring layer 114 forms a fuse 114A. The remaining regions of the metal wiring layer 114 are electrically connected to contact pads 116 via interconnections 118. The contact pads 116 comprise aluminum, or other similar material. The interconnections 118 comprise tungsten or other similarly used conductive material. The device 100 further includes wiring 120, formed of the same or similar material, and at the same time as the contact pads 116.

An alignment mark 142 is located within the "kerf" 140, or the space on the wafer 110 between adjacent devices 100. The alignment mark 142 is formed of the metal wiring layer 114, comprising a similar material as the fuse 114A. As described above, the alignment mark 142 provides an optical target for a laser during a subsequent laser fuse deletion process.

During formation of the device 100, an etch resistant or etch stop layer 130 is deposited on the surface of the substrate 112, covering the metal wiring layer 114, and particularly, covering the fuse 114A and the alignment mark 142. The etch stop layer 130 is deposited using a spin-on, CVD, PVD or other similar conventionally used deposition technique. The etch stop layer 130 comprises silicon nitride, or other similar material having a slower etch rate than that of the insulative layers thereabove (the reasons for which will be described in more detail infra). The etch stop layer 130 is deposited having a thickness of approximately 10–100 nm. The etch stop layer 130 provides a uniform remaining passivation thickness T' over both the fuse 114A and the alignment mark 142 for use during the subsequent fuse deletion process.

A first insulative layer 122, comprising oxide, located between the etch stop layer 130 over the metal wiring layer 114, the alignment mark 142 and the contact pads 116, provides electrical insulation between the metal wiring layer 114 and the contact pads 116. A plurality of insulative layers 124, 126 and 128 are deposited on the surface of the device 100 (including the alignment mark 142 within the kerf 140). The second insulative layer 124, comprising oxide or other similar material exhibiting an etch rate similar to that of the underlying first insulative layer 122 (the reasons for which will become more evident below), the third insulative layer 126 comprising nitride, and the fourth insulative layer comprising polyimide, are deposited over the device 100 using known techniques.

A photoresist (not shown) is deposited over the surface of the fourth insulative layer 128. Using a mask (not shown), openings are patterned within the fourth insulative layer 128 above the contact pads 116, the fuse 114A, and the alignment mark 142. Using an appropriate etch process, typically a RIE, or a wet etch, the fourth insulative layer 128 is etched down to the third insulative layer 126 in these patterned areas.

Thereafter, the third insulative layer 126 is etched above the contact pads 116, the fuse 114A and the alignment mark 142, using a dry RIE selective to the material within the third insulative layer 126. Likewise, the second insulative layer 124 is etched over the contact pads 116, the fuse 114A and the alignment mark 142, using a dry RIE selective to the material within the second insulative layer 124.

An "over-etch" is then performed, wherein any excess portions of the second insulative layer 24 are cleaned from the surface of the contact pads 116. Because the first insulative layer 122 comprises material having an etch rate similar to that of the second insulative layer 124, during the over-etch the first insulative layer 122 over the fuse 14A and the alignment mark 142 is etched down to the etch stop layer 130. Regardless of the duration of the over-etch, the etch stop layer 130 will not be removed because the material within the etch stop layer 130 has a much slower etch rate than that of the first and second insulative layers 122, 124.

Therefore, following the over-etch, all fuses 114A, both on the device 100 and on other devices of the wafer 110, as well as the alignment mark 142, have a uniform passivation thickness T' thereover. In particular, the remaining passivation thickness T' is defined by the approximate deposition thickness of the etch stop layer 130. As mentioned above, this is because the etch stop layer 130 has a slower etch rate than the first insulative layer 122 thereabove, which is removed during the over-etch. Therefore, regardless of the amount of time spent performing the over-etch, or the non-uniformity of the over-etch, the etch stop layer 130 will be minimally etched, if at all, leaving a known, uniform passivation thickness T' comprising the etch stop layer 130. This eliminates the need for the over-etch to be so closely monitored, as previously required.

During the laser fuse deletion process the laser is able to easily locate the alignment mark 142 because the passivation thickness T' of the etch stop layer 130 thereover is thin, thereby providing a clear optical location target. Furthermore, due to the uniformity of the passivation thickness T' over each fuse 114A, stresses caused due to excessive input energy are reduced or eliminated. This is because the laser may be pre-programmed with the appropriate deletion energy required to blow a fuse 114A through a passivation thickness T' that is approximately uniform from fuse 114A to fuse 114A.

It should be understood that the present invention has been illustrated and described in conjunction with an additional electrical feature, namely, contact pads 116, only as an example. It is in no way intended to be limited by the above description. Rather, the present invention is also intended for use alone or in combination with various other features.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

We claim:

1. A method of forming a fuse structure, comprising:
   providing a substrate and at least one fuse, wherein a portion of said at least one fuse is formed within a volumetric portion of the substrate;
   depositing a continuous etch resistant layer over a surface of the substrate, wherein the etch resistant layer is directly over an entire surface of the at least one fuse, and wherein the etch resistant layer is in direct mechanical contact with the at least one fuse; and
   forming at least one insulative layer directly above the etch resistant layer, wherein the etch resistant layer has a slower etch rate than that of the at least one insulative layer thereabove.

2. The method of claim 1, further comprising providing an alignment mark formed within the substrate at a location spatially removed from the fuse.

3. The method of clam 2, wherein the alignment mark is adapted to provide an optical target for a laser.

4. The method of claim 2, wherein the alignment mark further comprises the etch resistant layer thereover.

5. The method of claim 2, wherein the fuse and the alignment mark are formed within a metal wiring layer of the device.

6. The method of claim 2, wherein the substrate comprises at least one metal wiring layer within the substrate, wherein a first region of the metal wiring layer comprises the fuse, and wherein a second region of the metal wiring layer comprises the alignment mark.

7. The method of claim 1, wherein the etch resistant layer comprises silicon nitride.

8. The method of claim 1, wherein the substrate comprises at least one metal wiring layer within the substrate, and wherein a first region of the metal wiring layer comprises the fuse.

9. The method of claim 8, wherein a plurality of remaining regions of the metal wiring layer are electrically connected to contact pads.

10. A method of performing a fuse deletion process, comprising:
    providing a substrate having at least one fuse therein, an etch resistant layer over the fuse and at least one insulative layer over the etch resistant layer, wherein a portion of said at least one fuse is formed within a volumetric portion of the substrate;
    removing a portion of the at least one insulative layer above the fuse to the etch resistant layer; and
    applying a radiant energy source to the fuse until the etch resistant layer is partially removed.

11. The method of claim 10, further comprising providing an alignment mark formed within the substrate having the etch resistant layer and at least one insulative layer thereover.

12. The method of claim 11, wherein the fuse and the alignment mark are formed within a metal wiring layer of the substrate.

13. The method of claim 11, further comprising removing a portion of the at least one insulative layer above an electrical feature and the alignment mark while removing the at least one portion of the at least one insulative layer above the fuse.

14. The method of claim 11, further comprising:
    locating the alignment mark with the radiant energy source; and
    locating the fuse based upon the location of the alignment mark.

15. The method of claim 11, wherein the etch resistant layer provides a uniform passivation thickness over the fuse and the alignment mark.

16. The method of claim 15, wherein the etch resistant layer has a thickness of approximately 10–100 nm.

17. The method of claim 10, wherein removing a portion of the at least one insulative layer further comprises etching the insulative layer.

18. The method of claim 10, wherein applying a radiant energy source further comprises emitting a laser beam into the fuse.

19. The method of claim 10, wherein the etch resistant layer comprises silicon nitride.

20. A method of forming a fuse structure, comprising:

providing a substrate having at least one fuse formed within an interior portion of the substrate, wherein an exterior surface of the substrate is coplanar with an entire surface of the at least one fuse;

depositing a continuous etch resistant layer over said exterior surface of the substrate, wherein the etch resistant layer is directly over said entire surface of the at least one fuse, and wherein the etch resistant layer is in direct mechanical contact with the at least one fuse; and forming at least one insulative layer directly above the etch resistant layer, wherein the etch resistant layer has a slower etch rate than that of the at least one insulative layer thereabove.

* * * * *

UNITED STATES PATENT AND TRADEMARK OFFICE
CERTIFICATE OF CORRECTION

PATENT NO. : 6,946,379 B2
DATED : September 20, 2005
INVENTOR(S) : Daubenspeck et al.

It is certified that error appears in the above-identified patent and that said Letters Patent is hereby corrected as shown below:

Column 6,
Line 6, delete "clam" and insert -- claim --.

Signed and Sealed this

Twentieth Day of December, 2005

JON W. DUDAS
*Director of the United States Patent and Trademark Office*